US012758007B2

(12) United States Patent
Su et al.

(10) Patent No.: US 12,758,007 B2
(45) Date of Patent: Oct. 13, 2026

(54) BRUSH CLEANING SYSTEM AND BRUSH CLEANING METHOD

(71) Applicant: Taiwan Semiconductor Manufacturing Co., Ltd., Hsinchu (TW)

(72) Inventors: Ying-Chuan Su, Hsinchu (TW); Hao Yu Wang, Hsinchu (TW); Huan-Yung Lin, Hsinchu (TW); Shao-Yen Ku, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 18/361,680

(22) Filed: Jul. 28, 2023

(65) Prior Publication Data

US 2025/0033091 A1 Jan. 30, 2025

(51) Int. Cl.

| | |
|---|---|
| ***A46B 17/06*** | (2006.01) |
| ***H10P 72/00*** | (2026.01) |
| *B08B 3/02* | (2006.01) |

(52) U.S. Cl.

CPC .......... *A46B 17/06* (2013.01); *H10P 72/0414* (2026.01); *A46B 2200/3073* (2013.01); *B08B 3/02* (2013.01); *H10P 72/0412* (2026.01)

(58) Field of Classification Search

CPC ......... H01L 21/67046; H01L 21/67051; H10P 72/0412; H10P 72/0414; A46B 17/06

See application file for complete search history.

(56) References Cited

U.S. PATENT DOCUMENTS 5,685,039 A * 11/1997 Hamada ............ H01L 21/67046 15/21.1
2006/0213536 A1* 9/2006 Sato .................. H01L 21/67046 134/10
2015/0027489 A1* 1/2015 Lyu ..................... H10P 72/0412 134/1

FOREIGN PATENT DOCUMENTS

CN 115555329 A * 1/2023 .......... H10P 72/0428
KR 2007005803 A * 1/2007 ........... H01L 21/304

OTHER PUBLICATIONS

Machine translation of KR-2007005803-A, dated Jan. 10, 2007. (Year: 2007).*
Machine translation of CN-115555329-A, dated Jan. 3, 2023. (Year: 2023).*

* cited by examiner

*Primary Examiner* — Michael E Barr
*Assistant Examiner* — Kevin G Lee
(74) *Attorney, Agent, or Firm* — Seed IP Law Group

(57) ABSTRACT

A brush wetting and cleaning system or tool including a brush wetting and cleaning housing. A wetting nozzle in fluid communication with a cavity in the brush wetting and cleaning housing. The wetting nozzle is configured to, in operation, wet a brush of a brush head inserted into the cavity of the brush wetting and cleaning housing. A spray nozzle in fluid communication with the cavity in the brush wetting and cleaning housing. The spray nozzle is configured to, in operation, clean the brush of the brush head inserted into the cavity of the brush wetting and cleaning housing. In a method of utilizing the brush wetting and cleaning system or tool, the brush of the brush head is wetted and cleaned between cleaning successive wafers or workpieces.

20 Claims, 11 Drawing Sheets

BRUSH CLEANING SYSTEM AND BRUSH CLEANING METHOD

BACKGROUND

In processing of workpieces and manufacturing of integrated circuit devices, a cleaning brush is utilized to clean surfaces of workpieces (e.g., wafers or substrates to be processed). Cleaning the surfaces results in contaminants being removed from the surfaces of the workpieces in advance of further processes to refine or process the workpieces in manufacturing of integrated circuits. The cleaning brush may be utilized repeatedly and successively to clean several workpieces in succession before reaching the end of its usable life span. However, once the cleaning brush has been utilized to clean several workpieces and has reached the end of its usable life span, the cleaning brush may be replaced with a new, fresh cleaning brush. After being replaced, the cleaning brush, which has reached the end of its usable life span, may then be disposed of into a waste receptacle.

Furthermore, when the cleaning brush is utilized to clean several workpieces over their usable life span, the cleaning brush may become dirty throughout its use in cleaning several workpieces in succession. As the cleaning brush becomes dirty through successively cleaning several workpieces back to back, residual contaminants may build up on the cleaning brush overtime.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
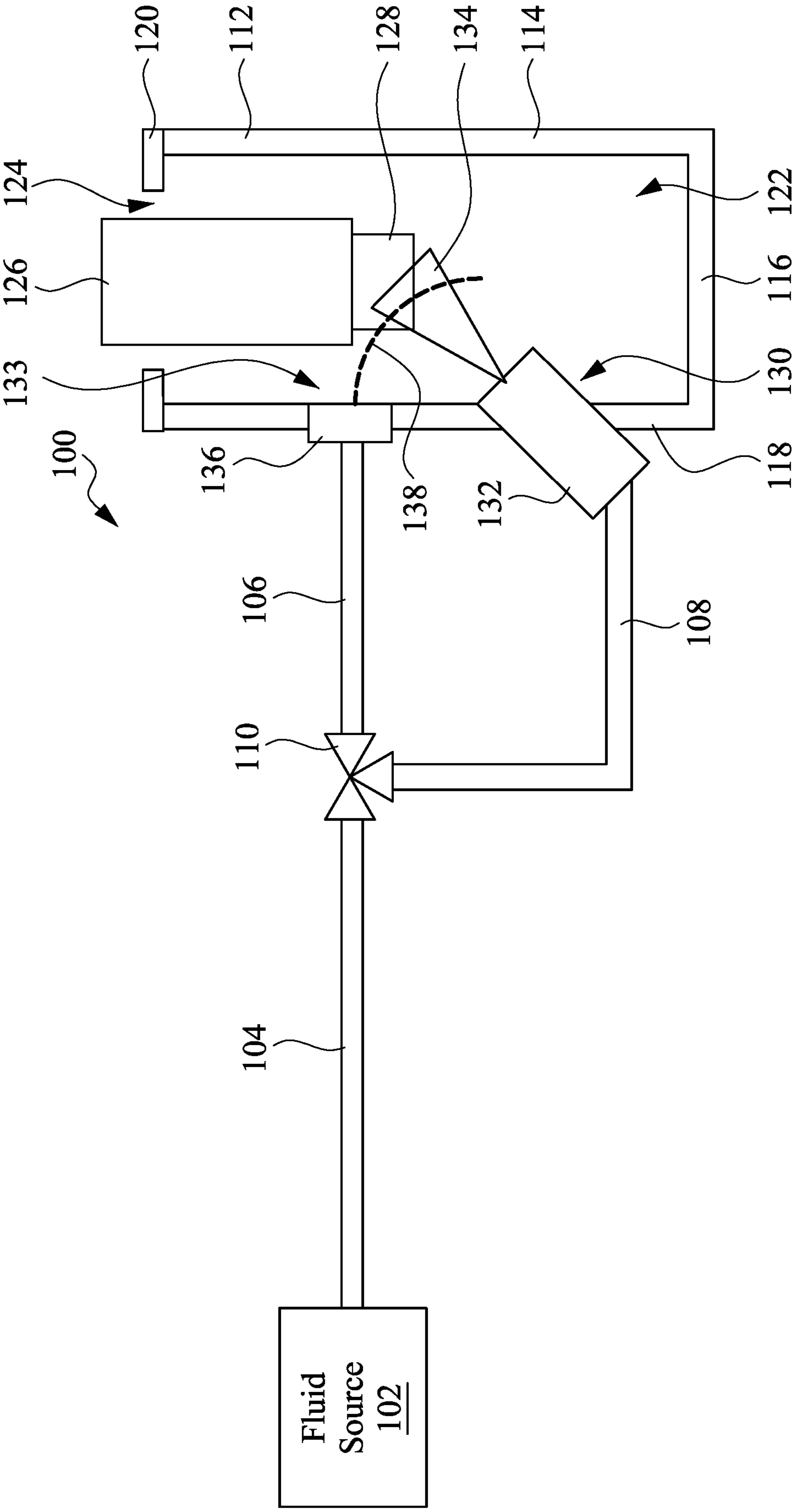
FIG. 1 is a side view of a brush cleaning system or tool, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below." "lower," "above." "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, integrated circuits are manufactured utilizing semiconductor workpieces (e.g., semiconductor wafers) that are cleaned in advance of further processing to manufacture the integrated circuits utilizing the cleaned semiconductor workpieces. For example, a surface of a semiconductor wafer may be cleaned utilizing a brush of a brush head by passing the brush over the surface and rotating the brush as the brush of the brush head moves along the surface of the semiconductor wafer. As the brush of the brush head is used successively to clean multiple respective surfaces of multiple semiconductor wafers in manufacturing integrated circuits, debris or contaminants build up on the brush of the brush head resulting in the brush of the brush head becoming dirty. As the debris or contaminants build up on the brush of the brush head through use, the debris or contaminants remaining on the brush of the brush head may increase a likelihood of defects propagating along surfaces of the semiconductor workpieces that may ultimately result in integrated circuits being manufactured containing these defects. These defects may result in a yield number of a semiconductor manufacturing plant (FAB) being reduced as these defects may cause integrated circuits to be manufactured outside of selected tolerances such that the out-of-tolerance integrated circuits may not be sold to customers or consumers.

The present disclosure is directed to providing one or more embodiments of a brush cleaning system, as well as a method of utilizing the brush cleaning system to clean a brush to prevent or reduce the likelihood of defects propagating along surfaces of workpieces as discussed earlier herein above. In other words, by cleaning the brush of the brush head, the debris or contaminants are removed from the brush of the brush head before cleaning a respective surface of a respective semiconductor workpiece that is to be cleaned by abutting the brush of the brush head to the respective surface while rotating the brush of the brush head. The details of these one or more embodiments of the brush cleaning system, as well as the one or more embodiments of the method of utilizing the brush cleaning system will be discussed in further detail herein.

FIG. 1 is a side view of a brush wetting and cleaning system or tool 100, in accordance with some embodiments. The brush wetting and cleaning system 100 including a fluid source 102 and one or more fluid pathways 104, 106, 108. In the embodiment of the brush wetting and cleaning system 100 as shown in FIG. 1, the one or more fluid pathways 104, 106, 108 include a first fluid pathway 104, a second fluid pathway 106, and a third fluid pathway 108. A three-way valve 110 is between the first, second, and third fluid pathways 104, 106, 108. The three-way valve 110 may be opened and closed along various directions to allow fluid to pass through the three-way valve 110 from the first fluid pathway 104 and into the second and third fluid pathways 106, 108, respectively. While not shown, a controller may be in electrical communication with the three-way valve 110 to open and close the three-way valve 110 along various directions to allow fluid from the first fluid pathway 104 through the three-way valve 110 and into the second and third fluid pathways 106, 108, respectively.

The brush wetting and cleaning system 100 further includes a brush wetting and cleaning housing 112. The brush wetting and cleaning housing 112 includes a plurality of housing walls 114, 116, 118, 120, and a cavity 122 of the brush wetting and cleaning housing 112 is delimited by the plurality of housing walls 114, 116, 118, 120. The cavity 122 may be referred to as a brush cleaning cavity, a brush head cleaning cavity, an internal cavity, an inner cavity, or some other similar or like type of reference to the cavity 122 of and within the brush wetting and cleaning housing 112. The brush wetting and cleaning housing 112 further includes a brush head opening 124 through which a brush head 126 may pass through to be inserted into the cavity 122. The brush head 126 includes a brush 128 that is to be cleaned by the brush wetting and cleaning system 100 as the brush wetting and cleaning system 100 is configured to, in operation, clean the brush 128 of the brush head 126.

A spray opening 130 of the brush wetting and cleaning housing 112 extends through one of the housing walls 118 such that a spray nozzle 132 is in fluid communication with the cavity 122 of the cleaning housing. The spray nozzle 132 is configured to, in operation, spray the brush 128 with a profiled spray 134 of fluid from the fluid source 102. In some embodiments, the profiled spray 134 may have a conical profile or may have some other suitable profile for the profiled spray 134. The spray nozzle 132 is configured to, in operation, clean the brush 128 of the brush head 126 when the brush 128 of the brush head 126 is within the cavity 122 of the brush wetting and cleaning housing 112. For example, the spray nozzle 132 ejects the profiled spray 134, which may be at a selected pressure (i.e., pressurized), and directs the profiled spray 134 at the brush 128 of the brush head 126 when within the cavity 122 of the brush wetting and cleaning housing 112 to remove debris or contaminants on the brush 128. The debris or contaminants may be residual debris or contaminants that remain on the brush 128 after the brush 128 was previously utilized to clean a respective surface of a respective semiconductor workpiece (e.g., a semiconductor wafer such as a silicon-based wafer). The profiled spray 134 may be a pressurized and atomized spray to facilitate removal of the debris or contaminants remaining on the brush 128 after the brush was previously utilized to clean the respective surface of the semiconductor workpiece. This removal of the debris or contaminants from the brush 128 of the brush head 126 prevents or reduces the likelihood of defects propagating at another surface of another semiconductor workpiece as the another surface of the another semiconductor workpiece is not exposed to the debris or contaminants. The prevention or reduction in likelihood of defects propagating within the another surface of the another semiconductor workpiece by cleaning the brush 128 of the brush head in advance of cleaning the another surface of the another semiconductor workpiece may increase a yield number of a FAB. The yield number of the FAB is the number of integrated circuits that are within selected tolerances that may be sold and shipped to customers or consumers.

A wetting opening 133 of the brush wetting and cleaning housing 112 extends through one of the housing walls 118 such that the wetting nozzle 136 is in fluid communication with the cavity 122 of the brush wetting and cleaning housing 112. The wetting nozzle 136 is configured to, in operation, apply a stream 138 of fluid from the fluid source 102 to the brush 128 of the brush head 126 to wet the brush 128 when the brush 128 is present within the cavity 122 of the brush wetting and cleaning housing 112. This wetting of the brush 128 maintains the brush in a wetted state such that the brush 128 does not dry out before cleaning another surface of another semiconductor workpiece after an initial surface of an initial semiconductor workpiece was cleaned. The brush 128 being in a wetted state when cleaning the another surface of the another semiconductor workpiece prevents or reduced the likelihood of defects propagating within or at the another surface of the another semiconductor workpiece as compared to if the brush 128 was instead in a dried state. For example, the brush 128 being in the wetted state prevents or reduces the likelihood of scratching along the another surface of the another semiconductor workpiece when being cleaned with the brush 128 in the wetted state as compared to, instead, when the brush is in the dried state in which there may be an increased likelihood of scratching along the another surface of the another semiconductor workpiece when being cleaned by the brush 128 in the dried state.

In some embodiments, the profiled spray 134 of fluid from the fluid source 102 ejected from the spray nozzle 132 may be at a first pressure, and the stream 138 of fluid from the fluid source 102 ejected from the wetting nozzle 136 is at a second pressure different from the first pressure. For example, in some embodiments, the first pressure is greater than the second pressure.

While as shown in FIG. 1, the spray opening 130 and the wetting opening 133 are both present along the same housing wall 118. In some embodiments, the spray opening 130 and the wetting opening 133 may be along different ones of the housing walls 114, 116, 118, 120 of the brush wetting and cleaning housing 112 instead of being present along the same wall (see, e.g., FIG. 2 of the present disclosure).

While not shown in FIG. 1, the brush wetting and cleaning housing 112 includes an outlet that allows for fluid ejected from the spray nozzle 132 and the wetting nozzle 136 to exit the brush wetting and cleaning housing 112 such that fluid ejected from the spray nozzle 132 and the wetting nozzle 136 does not build up within the cavity 122 of the brush wetting and cleaning housing 112. For example, the fluid that exits through the outlet may pass through a fluid recycling system that cleans and recycles the fluid. In some embodiments, once the fluid has been cleaned and recycled, the fluid may be reintroduced into the fluid source 102 to be reutilized again within the brush wetting and cleaning system 100 to clean the brush 128 of the brush head 126.

Figure 2:
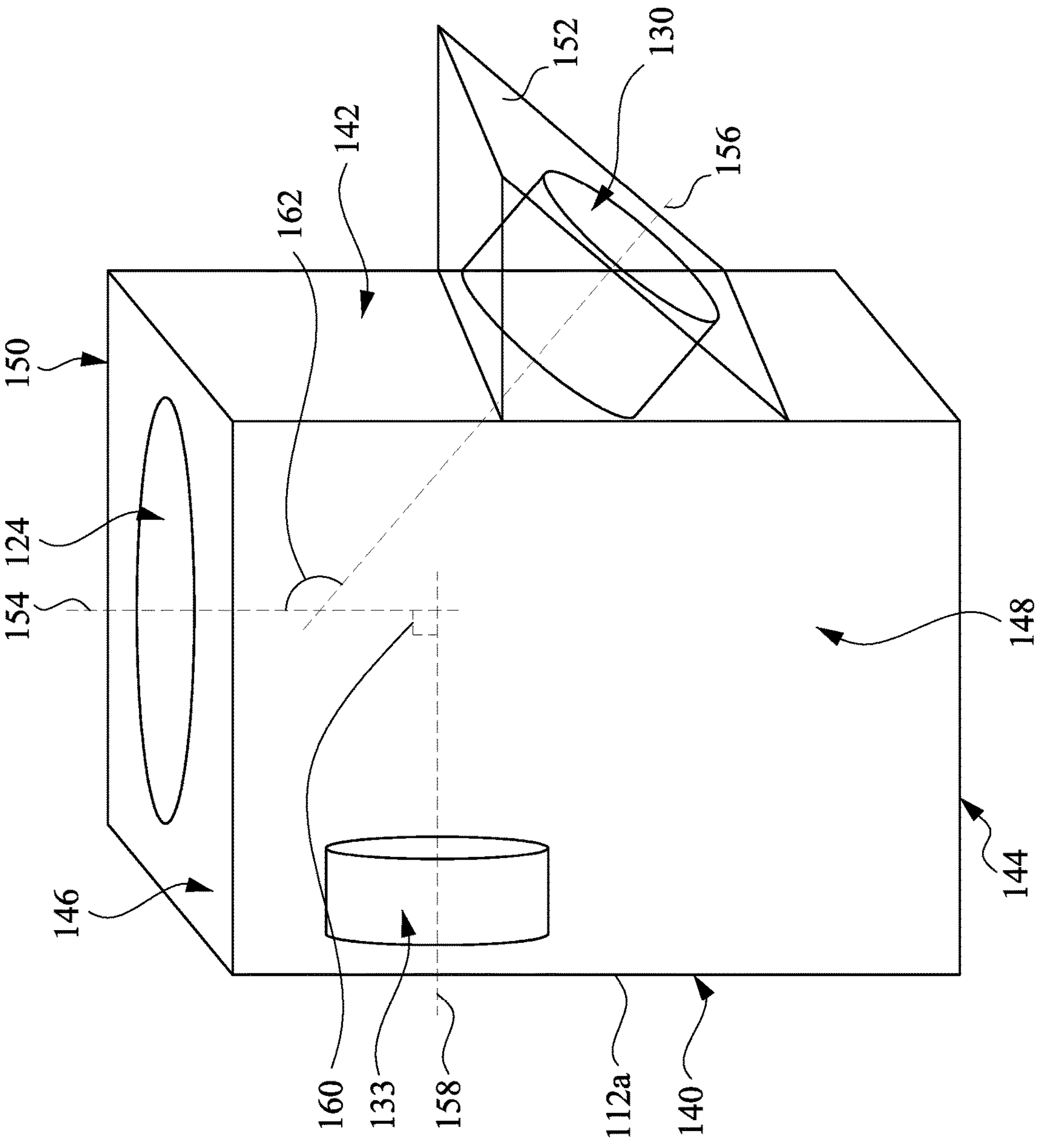
FIG. 2 is a perspective view of a housing of a brush cleaning system or tool, in accordance with some embodiments.

FIG. 2 is a perspective view of an embodiment of a brush wetting and cleaning housing 112*a* that may be utilized as the brush wetting and cleaning housing 112 in the brush wetting and cleaning system 100. As shown in FIG. 2, the brush wetting and cleaning housing 112*a* includes a plurality of housing walls 140, 142, 144, 146, 148, 150 as the brush wetting and cleaning housing 112 has a rectangular prism like profile. The plurality of housing walls 140, 142, 144, 146, 148, 150 includes a first housing wall 140, a second housing wall 142, a third housing wall 144, a fourth housing wall 146, a fifth housing wall 148, and a sixth housing wall 150. The second housing wall 142 is opposite to the first housing wall 140. The third housing wall 144 is transverse to the first and second housing walls 140, 142 and extends from the first housing wall 140 to the second housing wall 142. The fourth housing 146 is opposite to the third housing wall 144, is transverse to the first and second housing walls 140, 142, and extends from the first housing wall 140 to the second housing wall 142. The fifth housing wall 148 is transverse to the first, second, third, and fourth housing walls 140, 142, 144, 146, extends from the first housing wall 140 to the second housing wall 142, and extends from the third housing wall 144 to the fourth housing wall 146. The sixth housing wall is opposite to the fifth housing wall 148, is transverse to the first, second, third, and fourth housing walls 140, 142, 144, 146, extends from the first housing wall 140 to the second housing wall 142, and extends from the third housing wall 144 to the fourth housing wall 146.

In this embodiment of the brush wetting and cleaning housing 112*a*, the wetting opening 133 extends into and through the first housing wall 140 to the cavity 122 (not shown) within the brush wetting and cleaning housing 112*a*. While not shown, the wetting nozzle 136 is in fluid communication with the cavity 122 within the brush wetting and cleaning housing 112*a* through the wetting opening 133.

This embodiment of the brush wetting and cleaning housing 112*a* further includes a structure 152 that protrudes from the second housing wall 142 of the brush wetting and cleaning housing 112*a*. In this embodiment of the brush wetting and cleaning housing 112*a*, the structure 152 has triangular prism-like profile. In some alterative embodiments, the structure 152 may have some other suitable profile, for example, a conical prism profile, a cylindrical prism profile, a rectangular prism profile, or some other suitable type of profile. The spray opening 130 extends into and through the structure 152 to the cavity 122 within the brush wetting and cleaning housing 112*a*. While not shown, the spray nozzle 132 is in fluid communication with the cavity 122 through the spray opening 130. While not shown, in some embodiments, the structure 152 may include a threaded portion or may receive a threaded portion such that the spray nozzle 132 may be threadedly coupled to or threadedly mounted to the brush wetting and cleaning housing 112*a* such that the spray nozzle 132 is in fluid communication with the cavity 122 through the spray opening 130. In some alternative embodiments, the spray nozzle 132 may be coupled to or mounted to the brush cleaning housing or may be positioned in some other manner such that the spray nozzle 132 is in fluid communication with the cavity 122 through the spray opening 130.

The brush head opening 124 includes a first central axis 154, the spray opening 130 includes a second central axis 156, and the wetting opening 133 includes a third central axis 158. The first, second, and third central axes 154, 156, 158 are transverse to each other.

The first central axis 154 is at a first angle 160 relative to the third central axis 158. In this embodiment of the brush wetting and cleaning housing 112*a*, the first angle 160 is substantially equal to 90 degrees such that the first central axis 154 is perpendicular or orthogonal to the third central axis 158. In some alternative embodiments, the first angle 160 may be a different angle than as shown in FIG. 2.

The first central axis 154 is at a second angle 162 relative to the second central axis 156. In this embodiment of the brush wetting and cleaning housing 112*a*, the second angle 162 is greater than 90 degrees such that the second angle 162 is an obtuse angle (i.e., greater than 90 degrees). In some alternative embodiments, the second angle 162 may be a different angle than as shown in FIG. 2.

Figure 3:
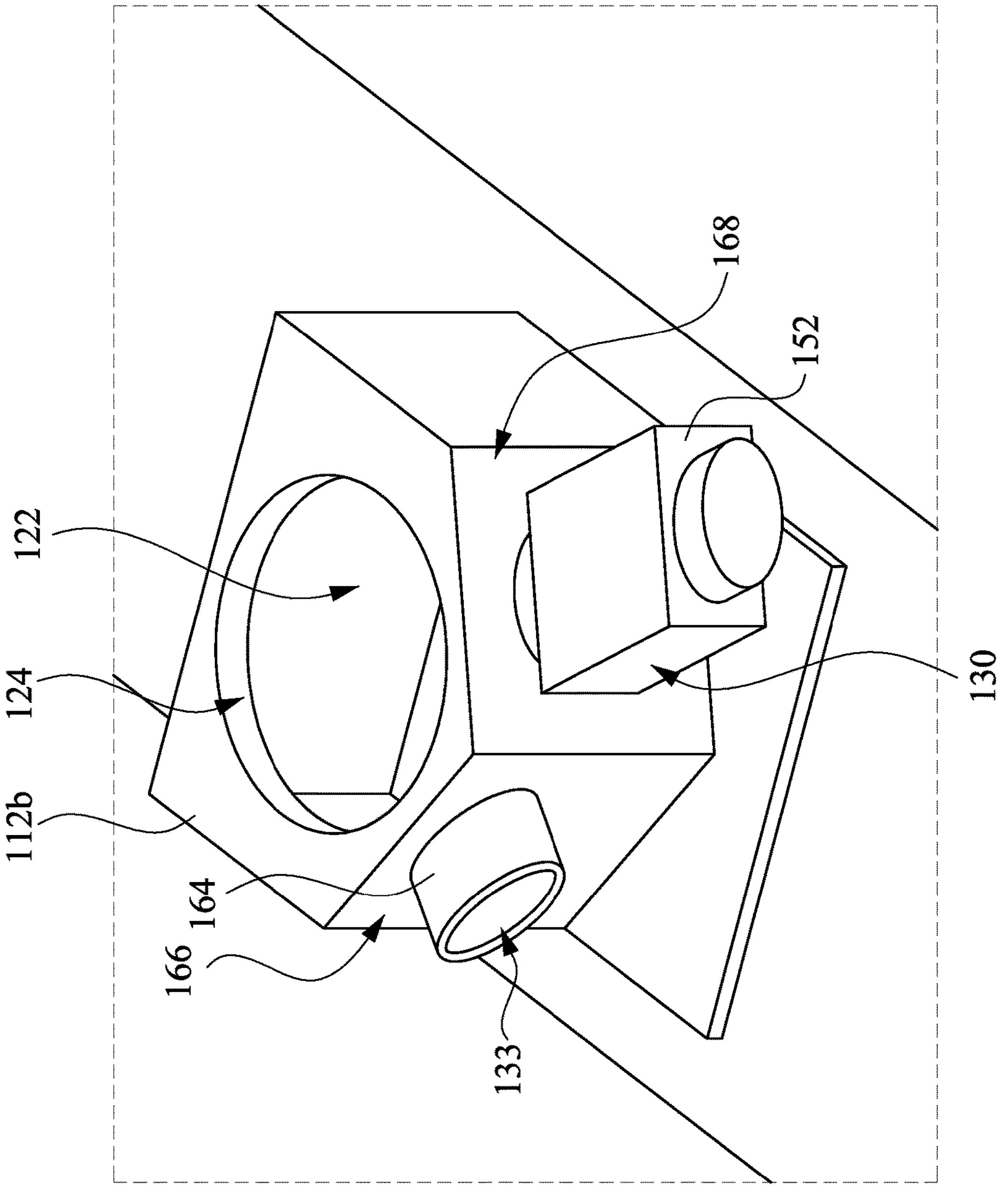
FIG. 3 a perspective view of an alternative housing of a brush cleaning system or tool, in accordance with some embodiments.

FIG. 3 is a perspective view of an alternative embodiment of a brush wetting and cleaning housing 112*b* that may be utilized as the brush wetting and cleaning housing 112 in the brush wetting and cleaning system 100. Unlike the embodiment of the brush wetting and cleaning housing 112*a* that has a rectangular prism profile, this alternative embodiment of the brush wetting and cleaning housing 112*b* has a triangular prism profile stacked on a rectangular prism profile such that an upper surface based on the orientation of the brush wetting and cleaning housing 112*a* as shown in FIG. 3 has a house-like shape (e.g., a triangular shape stacked on a rectangular shape).

As shown in FIG. 3, a threaded structure 164 protrudes outward from a first angled housing wall 166 and the structure 152 protrudes from a second angled housing wall 168. The first and second angled housing walls 166, 168 are directly adjacent to each other. In this alternative embodiment of the brush wetting and cleaning housing 112*b*, the wetting opening 133 extends through the threaded structure 164 to the cavity 122 such that the wetting nozzle 136 may be in fluid communication with the cavity 122 through the wetting opening 133. An outlet of the wetting nozzle 136 may be threaded such that the outlet of the wetting nozzle threadedly engages with the threaded structure 164 when coupling or mounting the wetting nozzle 136 to the threaded structure 164. In some alternative embodiments, the threaded structure 164 may be replaced with some other type of structure to which the wetting nozzle 136 may be coupled to such that the wetting nozzle 136 is in fluid communication with the cavity 122 through the wetting opening 133. In some alternative embodiments, the wetting nozzle 136 may be positioned in some other manner such that the wetting nozzle 136 is in fluid communication with the cavity 122 through the wetting opening 133.

While not shown for simplicity of FIG. 3, in this alternative embodiment of the brush wetting and cleaning housing 112*b*, the first central axis 154 of the brush head opening 124 may be at the first angle 160 relative to the third central axis 158 of the wetting opening 133, and the first central axis 154 of the brush head opening 124 may be at the second angle 162 relative to the second central axis 156 of the spray opening 130. In yet some other alternative embodiments, the first and second angles 160, 162 may be different than those as readily understood to be shown in FIG. 3.

Figure 4B:
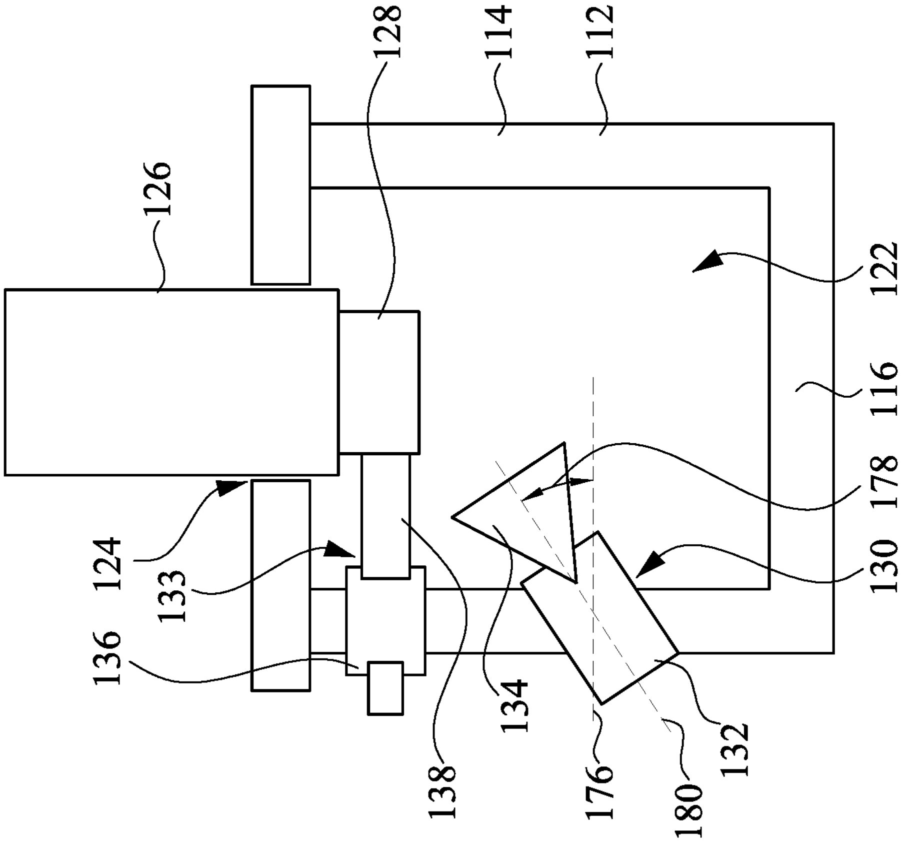
FIG. 4B is a side view of a nozzle angle of a spray nozzle of a brush cleaning system or tool, in accordance with some embodiments.
Figure 4A:
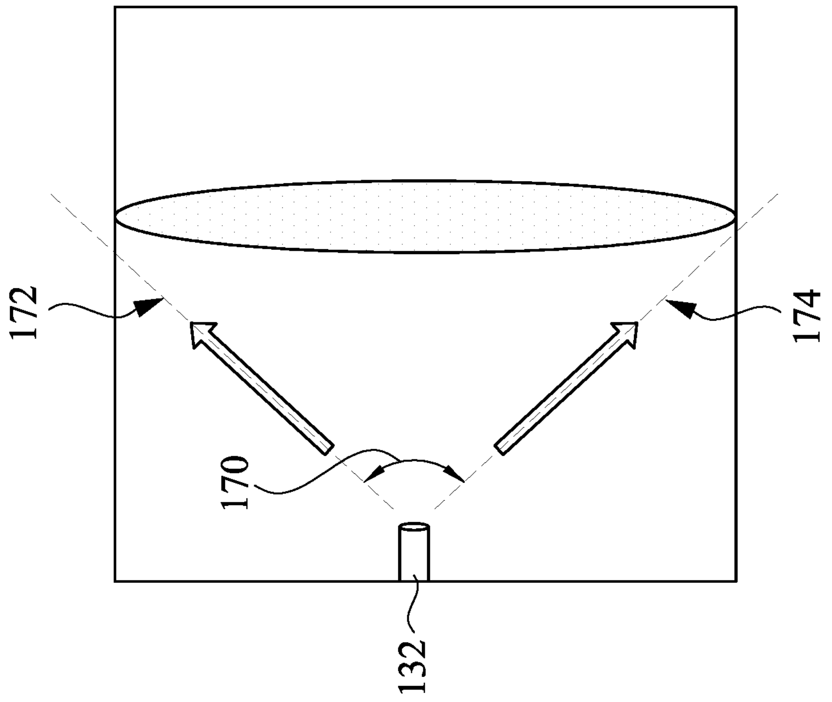
FIG. 4A is a side view of a spray angle of a spray nozzle of a brush cleaning system or tool, in accordance with some embodiments.

FIG. 4A is a side view of the profiled spray 134, which may be seen in FIG. 1 of the present disclosure as well. The profiled spray 134 includes a spray angle 170, which is an angle from a first side 172 of the profiled spray 134 to a second side 174 of the profiled spray 134 when viewed from the side as the profiled spray 134 may have a conical-like profile. The spray angle 170 may range from 55 to 75 degrees, or may be equal to the upper and lower ends of this range (i.e., equal to 55 degrees or equal to 75 degrees). In some situations, the spray angle may be equal to 65 degrees.

FIG. 4B is a side view of the brush wetting and cleaning housing 112, the brush head 126, the spray nozzle 132 and the wetting nozzle 136 as shown in FIG. 2 with some of the other features omitted to simplify FIG. 4B. A line 176, which is a horizonal line based on the orientation as shown in FIG. 4B, is at a nozzle angle 178 relative to a spray nozzle axis 180 such that the spray nozzle 132, the spray opening 130, or both are at the nozzle angle relative to the line 176. In some embodiments, the spray nozzle axis 180 and the second central axis 156 may fully overlap each other such that the spray nozzle axis 180 and the second central axis 156 are coincident with each other. In some embodiments, the nozzle angle 178 may be within the range from 5 degrees to 20 degrees, or may be equal to the upper and lower ends of this range (i.e., equal to 5 degrees or equal to 20 degrees). In some embodiments, the nozzle angle 178 may be equal to 10 degrees.

The spray nozzle may eject fluid at an injection flow rate that may be within the range from 0.1 to 1 liters per minute (L/min), or may be equal to the upper and lower ends of this range (i.e., equal to 0.1 L/min or equal to 1 L/min). In some embodiments, the injection flow crate may be equal to 0.3 liters per minute (L/min).

Figure 5:
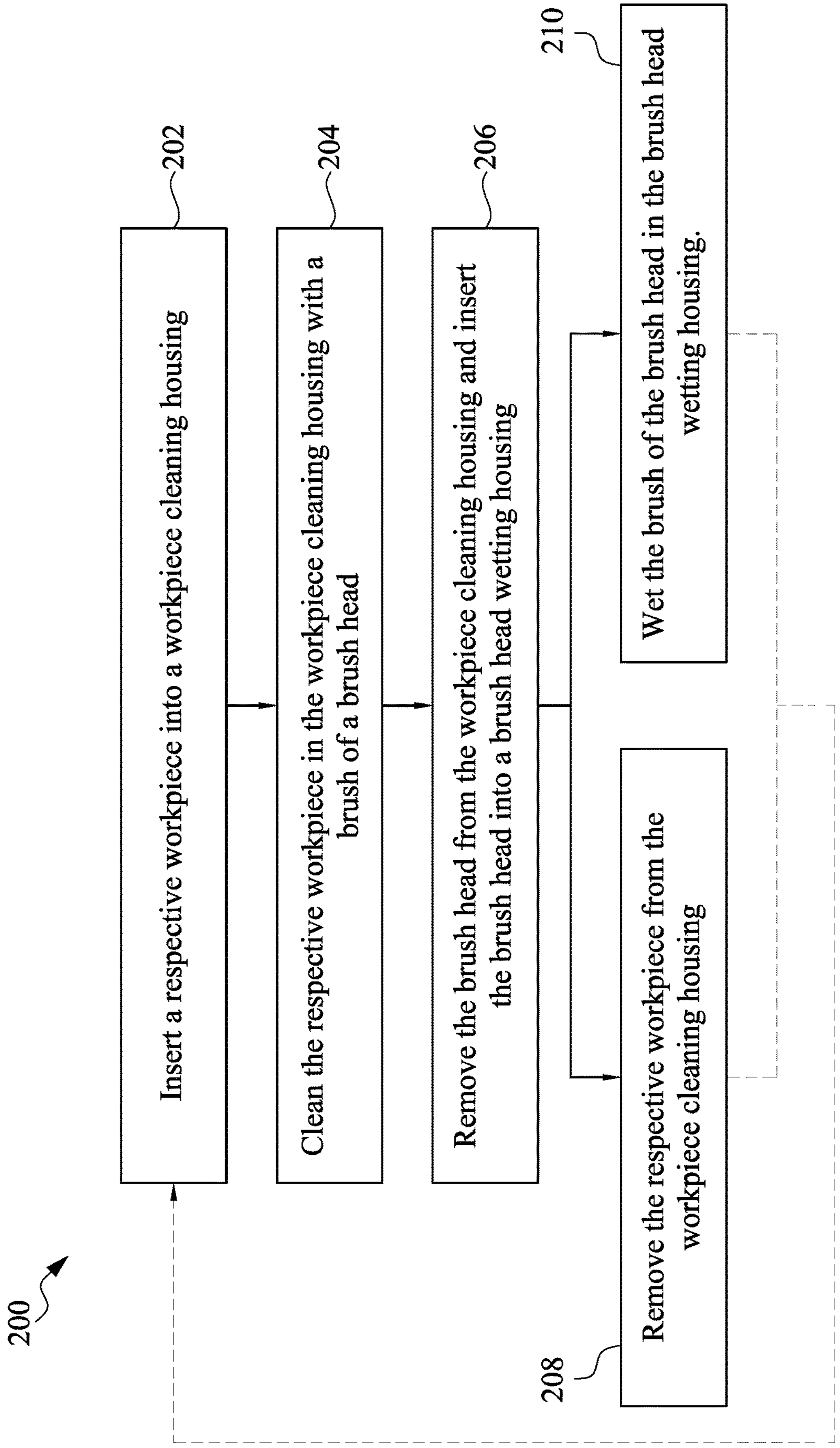
FIG. 5 is a flowchart of a method of cleaning a workpiece and wetting a brush of a brush head of a brush cleaning system or tool.

FIG. 5 is a flowchart 200 of a method of cleaning a respective workpiece (e.g., a wafer made of a semiconductor material such as a silicon or silicon based material) 306 and wetting a brush 302 of a brush head 304 of a brush head cleaning system or tool 300. The flowchart 200 includes a plurality of steps 202, 204, 206, 208, 210 of which the details will be discussed as follows with respect to the details as shown in FIGS. 6A-6C.

Figure 6A:
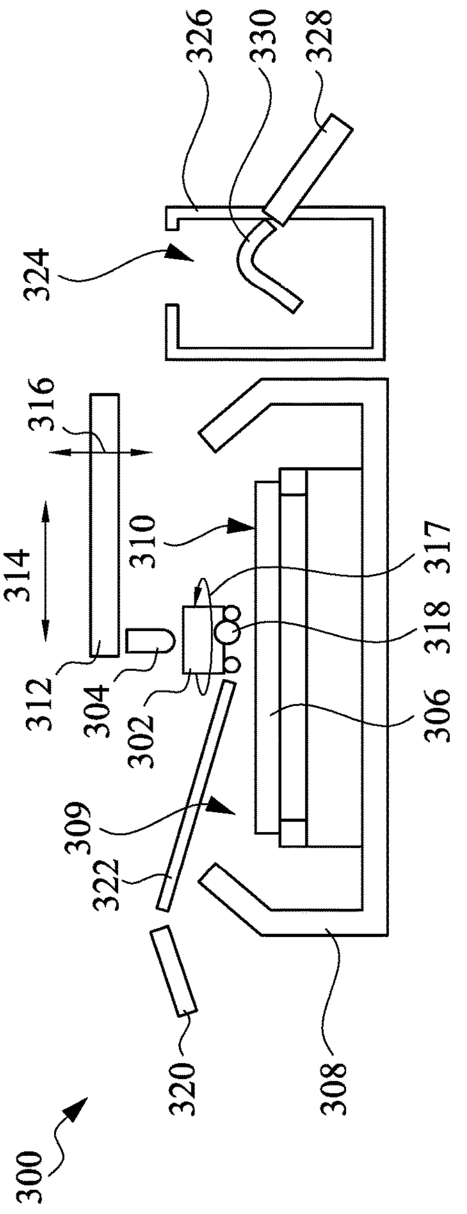
FIGS. 6A-6C are side views of respective steps of the flowchart as shown in FIG. 5.
Figure 6B:
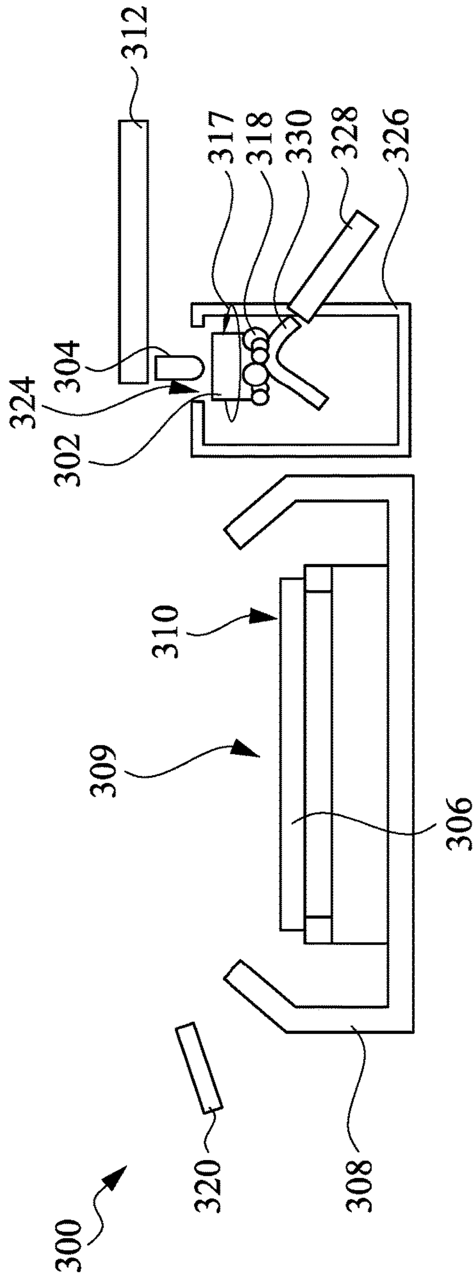
Figure 6C:
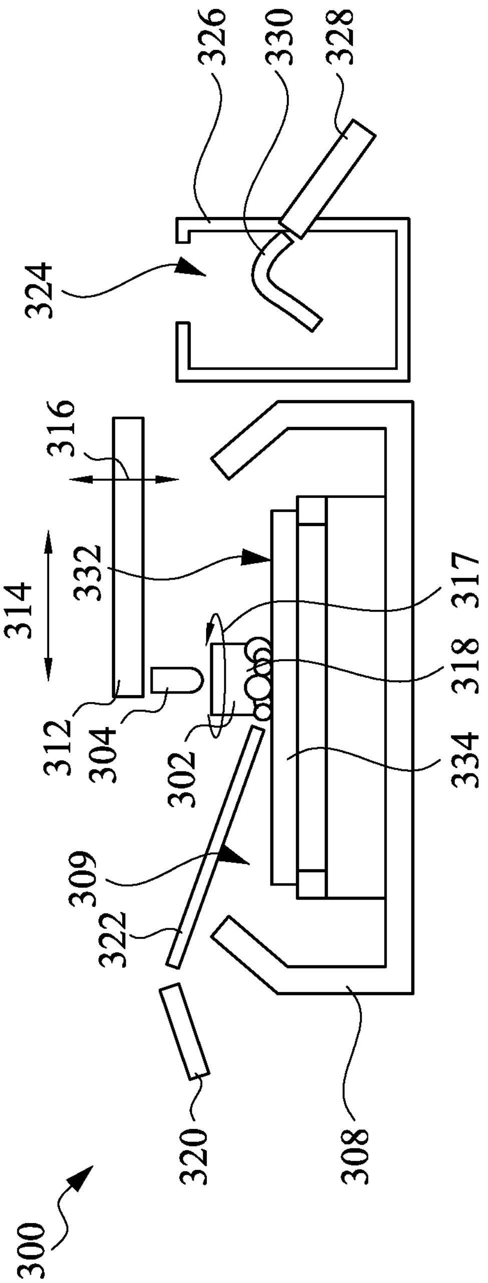

FIGS. 6A-6C are side views of at least some of the plurality of steps 202, 204, 206, 208, 210 of the flowchart 200. As shown in FIGS. 6A-6C the brush head cleaning system or tool 300 includes the brush head 304, which may be the same or similar to the brush head 126 as discussed earlier herein, and the brush head 304 includes a brush 302, which may be the same or similar to the brush 128 as discussed earlier herein. The brush head cleaning system or tool 300 further includes a workpiece cleaning housing 308 that is structured and configured to, in operation, receive the workpiece 306.

In a first step 202 of the flowchart 200, the respective workpiece 306 is inserted into the workpiece cleaning housing 308. The respective workpiece 306 being within the workpiece cleaning housing 308 after being inserted into the workpiece cleaning housing 308 is readily visible in FIG. 6A. The workpiece 306 may be inserted into the workpiece cleaning housing 308 by a transfer robot arm (TRA) with a transfer blade at an end of the TRA or by some other suitable workpiece transfer system, tool, or device that is configured to, in operation, insert the respective workpiece 306 into the workpiece cleaning housing 308. The respective workpiece 306 is inserted into the workpiece cleaning housing 308 by passing the respective workpiece 306 through a workpiece opening 309 in the workpiece cleaning housing 308.

After the first step 202 in which the respective workpiece 306 has been inserted into the workpiece cleaning housing 308, in the second step 204 as shown in FIG. 6B, at least one surface 310 of the respective workpiece 306 is cleaned by utilizing the brush 302 of the brush head 304. The brush head 304 is coupled, mounted, or attached to a translation structure 312 (e.g., a transfer robot arm (TRA)), and the translation structure 312 is configured to, in operation, move in first directions 314 (e.g., leftward and rightward directions based on the orientation as shown in FIGS. 6A-6C) and in second directions 316 (e.g., upward and downward directions based on the orientation as shown in FIG. 6A-6C). The translation structure 312 translates and moves the brush head 304 into position such that the brush 302 of the brush head 304 physically abuts or contacts the respective surface 310 of the respective workpiece 306 to clean the respective workpiece 306 within the workpiece cleaning housing 308. For example, the translation structure 312 may move in at least one of the first directions 314 to align the brush head 304 with the workpiece opening 309 in the workpiece cleaning housing 308. Once the brush head 304 is aligned with the workpiece opening 309, the brush head 304 is passed through the workpiece opening 309 and into the workpiece cleaning housing 308 by moving in at least one of the second directions 316 (e.g., the downwards direction based on the orientation as shown in FIGS. 6A and 6B). The translation structure 312 continues to move the brush head 304 in the at least one of the second directions 316 (e.g., the downwards direction based on the orientation as shown in FIGS. 6A and 6B) until the brush 302 of the brush head 304 physically abuts or contacts the respective surface 310 of the respective workpiece 306.

While the brush 302 physically abuts or contacts the respective surface 310 to clean the respective surface 310, the brush 302 is rotated in a rotation direction 317. At the same time the brush 302 rotates in the rotation direction 317, the translation structure 312 translates or moves the brush head 304 in at least one of the first directions 314 (e.g., leftward and rightward based on the orientation as shown in FIG. 6A) to clean the surface 310 of the respective workpiece 306. As the brush 302 rotates in the rotation direction 317 and is translated across the surface 310 in the first directions, the brush 302 cleans the respective surface 310 of the respective workpiece 306 by removing debris and contaminants 318 from the surface 310 of the respective workpiece 306. While some of the debris and contaminants 318 removed from the surface 310 are propelled into the workpiece cleaning housing 308, at least some of the debris or contaminants 318 removed from the surface 310 remain present on the brush 302 of the brush head after cleaning the surface 310 of the respective workpiece 306 with the brush 302 of the brush head.

As the brush 302 physically abuts or contacts the surface 310, is rotating in the rotation direction 317, and is moving across the surface 310 in at least one of the first directions 314, a workpiece wetting nozzle, hose, or structure 320 ejects a stream of fluid 322 at the surface of the respective workpiece 306. The workpiece wetting nozzle 320 ejects the stream of fluid 322 at the surface 310 of the respective workpiece 306 such that the surface 310 and the brush 302 remain wet and moist when cleaning the surface 310 with the brush to prevent or reduce the likelihood of propagation of defects at, on, and along the surface 310. These defects may include scratches, cracks, or some other similar or like defects that may occur at the surface 310 when the surface 310 and the brush 302 are overly dry and not wet and moist. The workpiece wetting nozzle 320 is actuatable to direct the stream of fluid 322 at the brush 302 to further facilitate wetting of the brush 302 when the brush 302 is cleaning the surface 310. In some alternative embodiments, the workpiece wetting nozzle 320 may be fixedly positioned such that the workpiece wetting nozzle 320 simply directs the stream of fluid at a selected point along and at the surface 310 of the workpiece 306 that allows for the surface 310 and the brush

302 to remain properly wet or moist when cleaning the surface 310 with the brush 302.

After the second step 204 in which the surface 310 of the respective workpiece 306 is cleaned by the brush 302 of the brush head 304 physically abutting or contacting the surface, the brush 302 rotating in the rotation direction 317, and the brush 302 moving along the surface 310 in at least one of the first directions 314, in a third step 206, the brush head 304 is removed from the workpiece cleaning housing 308 through the workpiece opening 309. The brush head 304 is removed from the workpiece cleaning housing 308 through the workpiece opening 309 by moving or translating the translation structure 312 in at least one of the second directions (e.g., the upward direction based on the orientation as shown in FIGS. 6A-6C). Once the brush head 304 has exited the workpiece cleaning housing 308 through the workpiece opening 309, the translation structure 312 moves or translates the brush head 304 in at least one of the first directions 314 (e.g., the rightward direction based on the orientation as shown in FIGS. 6A-6C) to be aligned with a brush head opening 324 in a brush head wetting housing 326. At least the brush 302 of the brush head 304 is then inserted into the brush head wetting housing 326 through the brush head opening 324 by moving or translating the brush head 304 in at least one of the second directions 316 (e.g., the downward direction based on the orientation as shown in FIGS. 6A-6C) and passing at least the brush 302 of the brush head 304 through the brush head opening 324 into the brush head wetting housing 326. In at least one embodiment of the method of the flowchart 200, the brush 302 continually rotates in the rotation direction 317 as the brush head 304 is removed from the workpiece cleaning housing 308 and is inserted into the brush head wetting housing 326. In at least one alternative embodiment of the method of the flowchart 200, the brush 302 stops rotating in the rotation direction 317 as the brush head 304 is removed from the workpiece cleaning housing 308 and is inserted into the brush head wetting housing 326, and, after at least the brush 302 of the brush head 304 is inserted into the brush head wetting housing 326 through the brush head opening 324, the brush 302 begins to rotate in the rotation direction 317 once inserted into and present within the brush head wetting housing 326.

While in this embodiment as shown in FIG. 6B the brush 302 rotates in the rotation direction 317 when present within the brush head wetting housing 326, in some alternative embodiments, the brush 302 may instead remain stationary such that the brush 302 does not rotate in the rotation direction 317 when being wetted by the brush wetting stream of fluid 330. While in this embodiment as shown in FIG. 6B the brush rotates in the rotation direction 317 when present within the brush head wetting housing 326, in some alternative embodiments, the brush 302 may rotate at some points in time and may remain stationary at other points in time as the brush 302 is being wetted by the brush wetting stream of fluid 330.

After the third step 206 in which the brush head 304 is removed from the workpiece cleaning housing 308 and at least the brush 302 of the brush head 304 has been inserted into the brush head wetting housing 326, in a fourth step 208, the respective workpiece with the surface 310 that is now clean, which is due to the second step 204 being completed, is removed from the workpiece cleaning housing 308 utilizing the TRA with the transfer robot blade. For example, the transfer robot blade at the end of the TRA is positioned underneath the respective workpiece 306 with the surface 310 that is now cleaned is then moved upward such that the transfer robot blade picks up the respective workpiece 306 and removes the respective workpiece 306 through the workpiece opening 309. While the transfer blade is present at the end of the TRA to insert and remove the respective workpiece 306 into and out of the workpiece cleaning housing 308 through the workpiece opening 309, in some alternative embodiments, the transfer blade at the end of the TRA may be replaced with another type of end effector that may be utilized and configured to, in operation, to insert and remove the respective workpiece 306 from the workpiece cleaning housing 308 through the workpiece opening.

While the fourth step 208 is described above as occurring after the third step 206 is fully complete, in some embodiments, the fourth step 208 may initiate in advance of at least the brush 302 of the brush head 304 being inserted into the brush head wetting housing 326 through the brush head opening 324. In other words, the fourth step 208 may at least partially occur as the third step 206 is being performed and completed.

The result of the third step 206 in which the brush head 304 is removed from the workpiece cleaning housing 308 through the workpiece opening 309 and at least the brush 302 is inserted into the brush head wetting housing 326 through the brush head opening 324 is visible in FIG. 6A. The result of the fourth step 208 in which the workpiece 306 is removed from the workpiece cleaning housing 308 through the workpiece opening 309 is visible in FIG. 6A.

When the brush head 304 and the respective workpiece 306 are being removed from the workpiece cleaning housing 308 in the third and fourth steps 206, 208, respectively, the workpiece wetting nozzle 320 stops ejecting the stream of fluid 322. The workpiece wetting nozzle 320 stopping ejection of the stream of fluid 322 is readily visible in FIG. 6B.

After the third step 206 in which the brush head 304 is removed from the workpiece cleaning housing 308 through the workpiece opening 309 and at least the brush 302 is inserted into the brush head wetting housing 326 through the brush head opening 324, in a fifth step 210 the brush 302 of the brush head 304 is wetted by a brush head wetting nozzle 328 that ejects a brush head wetting stream of fluid 330. As shown in FIGS. 6A-6C, the brush head wetting nozzle 328 continuously ejects the brush head wetting stream of fluid 330. However, in some alternative embodiments, the brush head wetting nozzle 328 may be turned off when at least the brush 302 of the brush head 304 is not present within the brush head wetting housing 326.

As shown in FIGS. 6A-6C the brush head wetting nozzle 328 is at an angle relative to a sidewall of the brush head wetting housing 326. In other words, the wetting nozzle 328 is not perpendicular or orthogonal to the sidewall of the brush head wetting housing 326.

The brush head wetting stream of fluid 330 is at a low pressure such that the brush 302 of the brush head 304 is undamaged when being wetted by the brush wetting stream of fluid 330. The wetting nozzle 328 ejects the brush head wetting stream of fluid 330 such that the brush 302 of the brush head 304 remains in a wetted or moist state to prevent or reduce the likelihood of propagation of defects at, on, and along a surface 332 of a successive respective workpiece 334 (see FIG. 8C) to be cleaned by the brush 302. These defects may include scratches, cracks, or some other similar or like defects that may occur at the surface 332 when being cleaned by the brush 302 due to the brush being overly dry and not wet and moist. However, as the brush 302 is in the wetted and moist state when cleaning the surface 332 due to the brush head wetting stream of fluid 330, the likelihood of propagation of these defects is prevented or reduced.

As the brush wetting stream of fluid 330 is at the low pressure, the debris and contaminants 318 that remained present on the brush 302 due to cleaning the surface 310 of the respective workpiece 306 are not removed from the brush 302 by the brush wetting stream of fluid 330. In other words, while the low pressure of the brush wetting stream of the fluid 330 wets the brush 302 and does not damage the brush 302 to maintain the brush 302 in a wet or moist state between cleaning operations of multiple respective workpieces, the debris and contaminants 318 remain present on the brush 302 such that the surface 332 of a successive respective workpiece 334 is exposed to the debris and contaminants 318 that remain present on the brush 302. The debris and contaminants remaining present on the brush 302 results in or increases the likelihood of defects propagating within surfaces of successive workpieces that are cleaned by the brush cleaning system or tool after the respective workpiece 306.

After the fifth step 210 in which the brush 302 is maintained in the wetted or moist state between cleaning operations, the method of the flowchart is performed again to clean the successive respective workpiece 334. In other words, the method described in the flowchart 200 is performed over and over again to clean multiple respective workpieces in successive utilizing the brush 302.

The successive workpiece 334 being cleaned by the brush 302 is visible in FIG. 6C. Even though the debris and contaminants 318 remain present on the brush 302, the brush 302 is brought into physical contact or abutment with the surface 332 of the successive respective workpiece 334 to clean the surface 332. The presence of the debris and contaminants 318 on the brush 302 results in or increases the likelihood of defects propagating on, at, or along the surface 332 of the successive workpiece 334. Furthermore, as the brush 302 is utilized the clean the surface 332, additional amounts of the debris or contaminants 318 build up on the brush 302. This continual buildup of the debris and contaminants 318 on the brush 302 when cleaning multiple workpieces in succession by performing the method in the flowchart 200 repeatedly and successively results in the brush 302 quickly becoming dirty such that the usable life span of the brush 302 is relatively short. In other words, the replacement time of the brush 302 is short due to the brush 302 quickly becoming overly dirty through successive utilizations in cleaning multiple surfaces of multiple respective workpieces. This continual buildup of the debris and contaminants 318 not only decreases the usable life span of the brush 302 resulting in a short replacement time, but it also increases the likelihood of the propagation of defects along surfaces of respective workpieces that are cleaned by the brush 302 in succession. This short replacement time of the brush 302 results in increased replacement expenses, and the increasing likelihood of the propagation of defects on, at, or along surfaces of workpieces results in a decreased yield number increasing waste and manufacturing costs.

As shown in FIG. 6C, the debris and contaminants 318 build up even further as the brush 302 cleans the surface 332 of the respective successive workpiece 334. In view of this, as further surfaces of respective workpieces are cleaned by the brush 302, the debris and contaminants 318 quickly and continually build up on the brush 302 resulting in the brush becoming quickly dirty and needing to be replaced.

As shown in FIGS. 6A-6C, the brush head wetting housing 326 is in close proximity to the workpiece cleaning housing 308. In other words, the brush head wetting housing 326 is in close proximity to the workpiece cleaning housing 308 to reduce a distance at which the brush head 304 has to travel to insert at least the brush 302 of the brush head 304 into either of the workpiece cleaning housing 308 or the brush head wetting housing 326, respectively, when traveling between the workpiece cleaning housing 308 and the brush head wetting housing 326.

Figure 7:
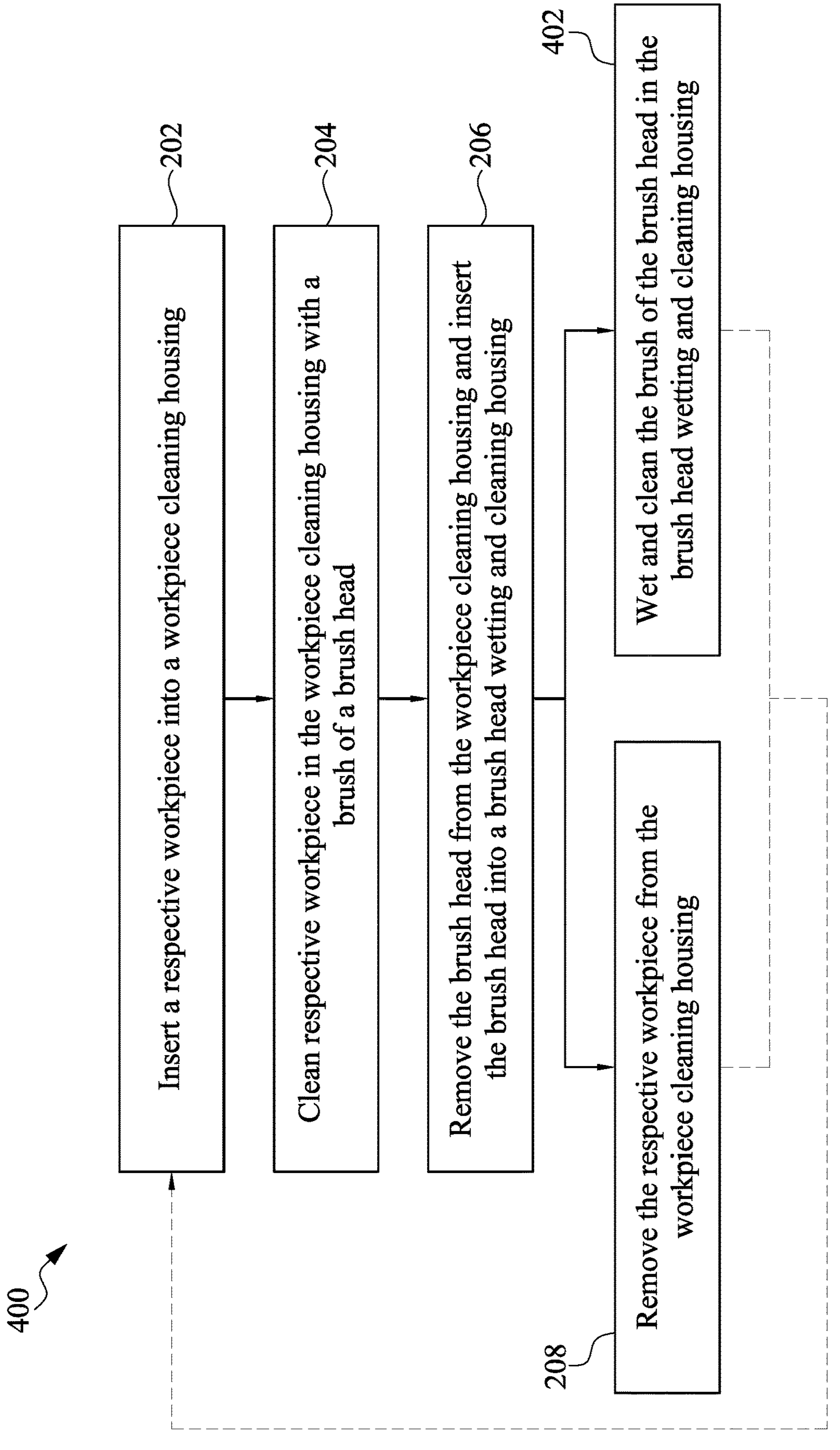
FIG. 7 is a flowchart of a method of cleaning a workpiece, cleaning a brush of a brush head of a brush cleaning system or tool, and wetting the brush of the brush cleaning system or tool, in accordance with some embodiments.
Figure 8A:
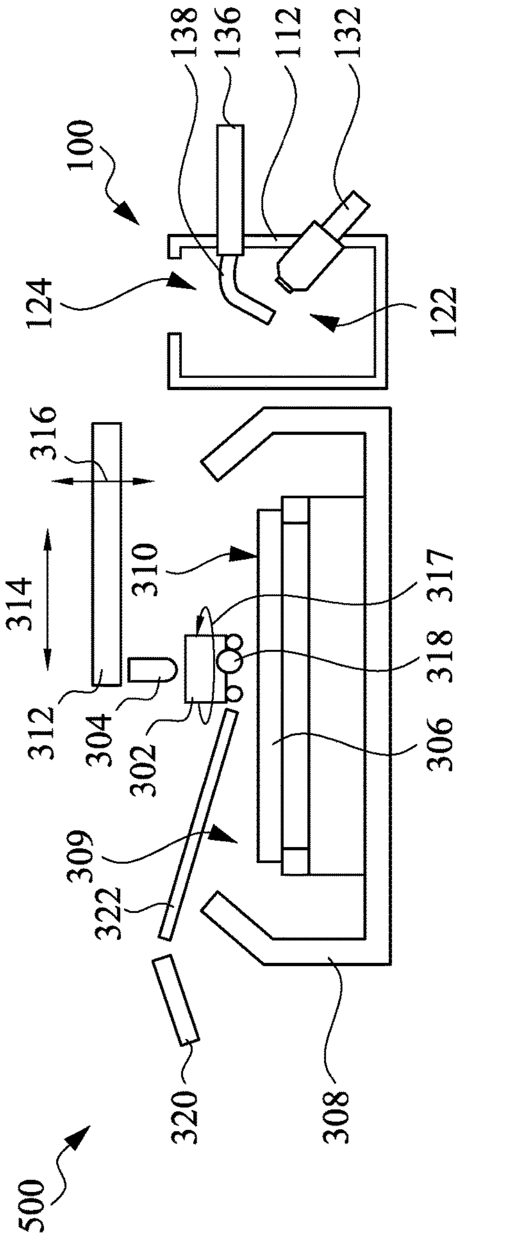
FIGS. 8A-8C are side views of respective steps of the flowchart as shown in FIG. 7, in accordance with some embodiments.
Figure 8B:
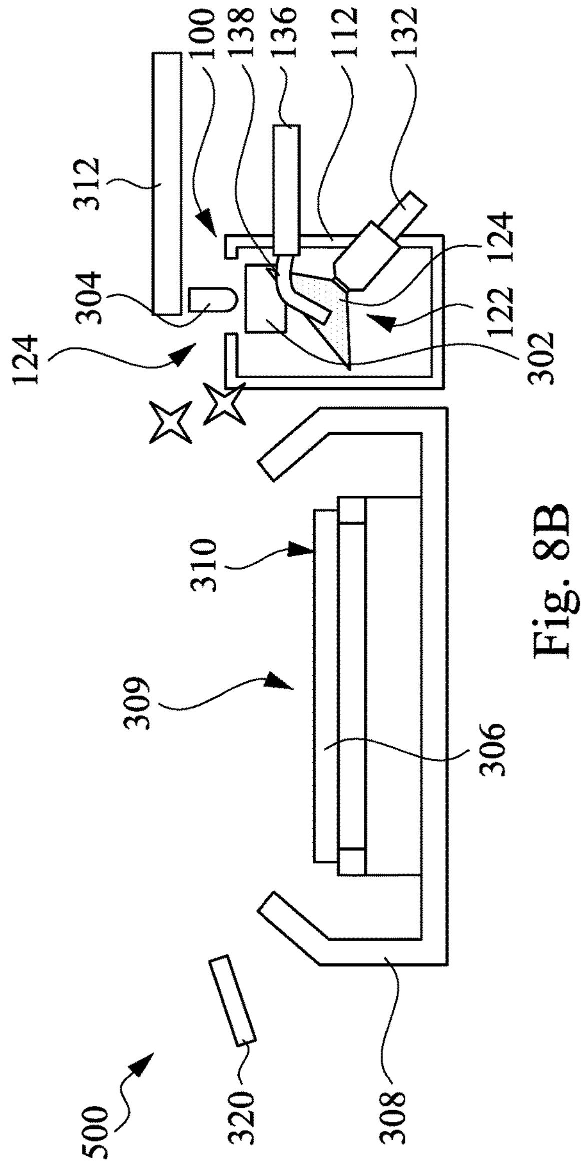
Figure 8C:
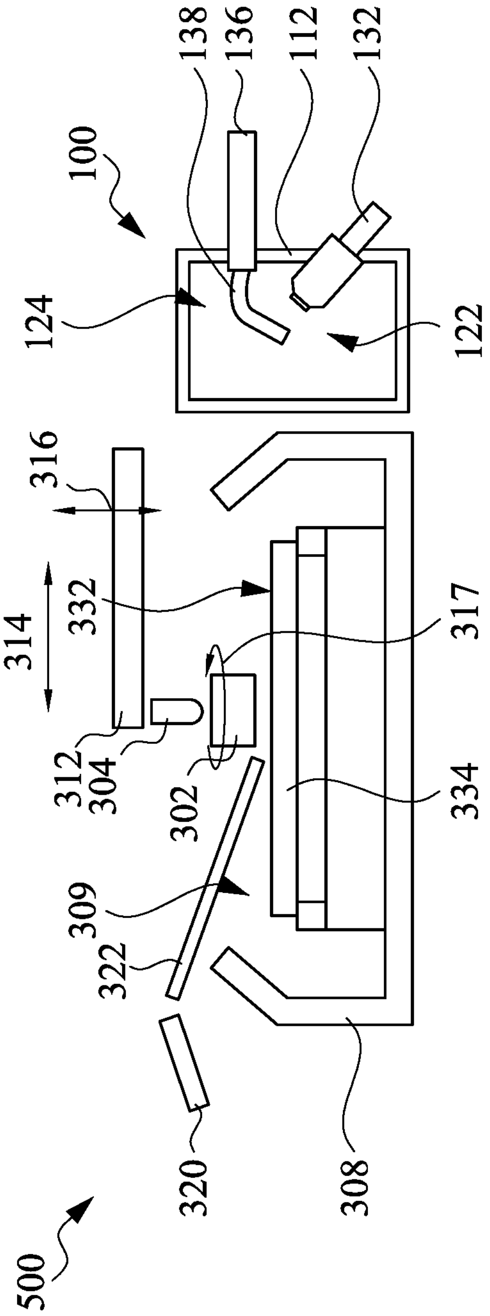

While the method in the flowchart 200 results in the brush 302 becoming dirty very quickly and results in an increasing likelihood of the propagation of defects on, at, or along surfaces of workpieces cleaned by the brush 302, a method in a flowchart 400 as shown in FIG. 7 increases the usable life span of the brush 302 and reduces the likelihood of defects propagating within surfaces of respective workpieces that are cleaned by a brush head cleaning system or tool 500 as shown in FIGS. 8A-8C.

FIG. 7 is a flowchart 400 of a method of cleaning a respective workpiece (e.g., a wafer made of a semiconductor material such as a silicon or silicon based material) 306 and wetting and cleaning the brush 302 of the brush head 304 of a brush head cleaning system 500. The flowchart 400 includes the first, second, third, and fourth steps 202, 204, 206, 208 as discussed in detail earlier herein with respect to FIGS. 5 and 6A-6C. However, unlike the method in the flowchart 200, the method in the flowchart 400 replaces the fifth step 210 with a sixth step 402. For the sake of simplicity and brevity of the present disclosure, as the details of the first, second, third, and fourth steps 202, 204, 206, 208 have already been discussed in detail earlier herein with respect to FIGS. 5 and 6A-6C, the details of the first, second, third, and fourth steps 202, 204, 206, 208 are not reproduced herein.

The method in the flowchart 400 proceeds through the first, second, third and fourth steps 202, 204, 206, 208 in the same or similar manner as discussed earlier herein with respect to the method in the flowchart 200. However, the fifth step in the method of the flowchart 200 is replaced with the sixth step 402 in the method of the flowchart 400. Furthermore, the brush head cleaning system 500 as present in FIGS. 8A-8C replaces the brush head wetting housing 326 with the brush wetting and cleaning housing 112 and further includes the spray nozzle 132. In other words, the brush wetting and cleaning system 100 is incorporated into the brush cleaning system or tool 500 such that the brush wetting and cleaning housing 112 is in close proximity to the workpiece cleaning housing 308.

Unlike the fifth step 210 in which the brush 302 is only wetted by the brush head wetting nozzle 328, in the sixth step 402 the brush 302 of the brush head 304 is both wetted and cleaned. The brush 302 of the brush head 304 is both wetted by the stream 138 ejected from the wetting nozzle 136 and cleaned by the profiled spray 134 ejected from the spray nozzle 132 simultaneously. As discussed earlier herein with respect to FIG. 1, the profiled spray 134 of fluid ejected from the spray nozzle 132 is at the first pressure that is greater than the second pressure at which the stream 138 (i.e., wetting stream) is ejected from the wetting nozzle 136.

In this sixth step 402, the spray nozzle 132 ejects the profiled spray 134 of the fluid at the first pressure which causes the debris and contaminants 318 to be removed from the brush 302 of the brush head. This removal of the debris and contaminants 318 from the brush 302 before the brush 302 is successively utilized to clean the surface 332 of the successive respective workpiece 334 prevents or reduces the likelihood of defects propagating on, at, or along the surface 332 of the successive respective workpiece 334 as the debris and contaminants 318 have been removed from the brush 302 beforehand by the profiled spray 134 ejected from the spray nozzle 132.

In the sixth step 402, the wetting nozzle 136 ejects the stream 138 of fluid such that the brush 302 of the brush head 304 remains in a wetted or moist state to prevent or reduce the likelihood of propagation of defects at, on, and along the surface 332 of the successive respective workpiece 334 to be cleaned by the brush 302. These defects may include scratches, cracks, or some other similar or like defects that may occur at the surface 332 when being cleaned by the brush 302 due to the brush being overly dry and not wet and moist. However, as the brush 302 is in the wetted and moist state when cleaning the surface 332 due to the stream 138, the likelihood of propagation of these defects is prevented or reduced.

As the stream 138 is at the second pressure (e.g., low pressure), the brush 302 of the brush head 304 is undamaged when being wetted by the stream 138. As the stream of fluid 330 is at the second pressure, the debris and contaminants 318 would more likely remain present on the brush 302 without the presence of the profiled spray 134 at the first pressure (e.g., high pressure). In other words, while the low pressure of the brush wetting stream of the stream of fluid 330 wets the brush 302 and does not damage the brush 302 to maintain the brush 302 in a wet or moist state between cleaning operations of multiple respective workpieces, the debris and contaminants 318 would remain present on the brush 302. However, as the profiled spray 134 ejected from the spray nozzle 132 is present, the profiled spray 134 removes the debris and contaminants 318 from the brush 302 while the stream 138 wets the brush 302 maintaining the brush 302 in the wetted or moist state. While the profiled spray 134 may be at the second pressure, which is greater than the first pressure, as the profiled spray 134 has the spray angle 170 (see FIG. 4A), the spray nozzle 132 is at the nozzle angle 178 (see FIG. 4B), and the profiled spray 134 is an atomized spray, the profiled spray 134 ejected from the spray nozzle 132 does not damage the brush 302 even at the first pressure, which is greater than the second pressure of the stream 138 ejected from the wetting nozzle 136.

In view of the above discussion, due to the sixth step 402 in the method of the flowchart 400 replacing the fifth step 210 in the method of the flowchart 200, the debris and contaminants 318 are removed from the brush 302 by the profiled spray 134 and the wetted or moist state of the brush is maintained by the stream 138. As the brush 302 is both wetted and cleaned in the sixth step 402 unlike in the fifth step 210 in which the brush 302 is only wetted and the debris and contaminants 318 are not removed from the brush, the usable life span of the brush 302 is increased and the prevention of the propagation of defects in the surface 332 of the successive respective wafer 334 is increased.

The usable life span of the brush 302 is increased as the brush 302 is cleaned between each cleaning operation of multiple workpieces in succession such that the debris and contaminants 318 take a longer time to build up on the brush 302 such that the brush takes a longer time to become dirty to the point at which it can no longer be utilized to clean workpieces. In other words, as the brush 302 remains cleaner for longer, the time between replacing the brush 302 with a new brush is increased, which reduces replacement costs when processing multiple workpieces.

The prevention of the propagation of defects in the surface 332 of the successive respective workpiece 334 as well as in surfaces of additional successive respective workpieces to be cleaned by the brush 302 are reduced as the debris and contaminants 318 do not build up on the brush 302 as the brush 302 is cleaned between each cleaning operation of each successive respective workpiece to be cleaned. For example, while the debris and contaminants 318 build up on the brush 302 as shown in FIG. 6C as the brush 302 was not cleaned to remove the debris and contaminants 318 between successive cleaning operations of multiple workpieces, the brush 302 is cleaned between each successive cleaning operation such that the debris and contaminants 318 are removed by the profiled spray 134 as shown in FIG. 8B. This results in the debris and contaminants 318 not being present on the brush 302 (see FIG. 8C) when the brush 302 is being utilized to clean the surface 332 of the successive respective workpieces. This cleaning of the brush 302 between each cleaning operation increases prevention of the propagation of defects in surfaces of successive respective workpieces to be cleaned by the brush 302 in succession through multiple cleaning operations.

As the brush 302 is wetted by the stream 138 along with cleaning the brush 302 with the profiled spray 134, the brush 302 remains in a wetted or moist state further reducing the likelihood of defects propagating on, at, or along the surface 332 of the successive respective workpiece 334. The likelihood of the propagation of defects on, at, or along the surface 332 is further reduced as the brush 302 is in the wetted or moist state when the brush 302 comes into physical contact or abutment with the surface 332 to clean the surface. In other words, the brush 302 is not dry when coming into physical contact or abutment with the surface 332 to clean the surface. If the brush 302 was dry when cleaning the surface 332, the dryness of the brush 302 would cause the propagation of defects or increase the likelihood of the propagation defects (e.g., scratches, cracks, or other similar or like type of defects) on, at, or along the surface 332.

While the above discussion of the method in the flowchart 600 discuses cleaning the brush 302 between each cleaning operation of each successive respective workpiece, in an alternative embodiment, the brush 302 may instead be cleaned only after a selected number of cleaning operations have been performed utilizing the brush 302. This may be done to balance the need to reduce downtime of the brush cleaning system or tool 500 against the need to prevent defects within multiple workpieces to be processed by the brush cleaning system or tool 500.

The brush 302 as shown in FIGS. 6A-6C and FIGS. 8A-8C may be the same or similar to the brush 128 as discussed in detail earlier herein with respect to FIG. 1. The brush head 304 as shown in FIGS. 6A-6C and FIGS. 8A-8C may be the same or similar to the brush head 126 as discussed in detail earlier herein with respect to FIG. 1.

As shown in FIGS. 8A-8C, the wetting nozzle 136 continuously ejects the stream 138 of fluid. However, in some alternative embodiments, the wetting nozzle 136 may be turned off when at least the brush 302 of the brush head 304 is not present within the brush head wetting housing 326.

Figure 9:
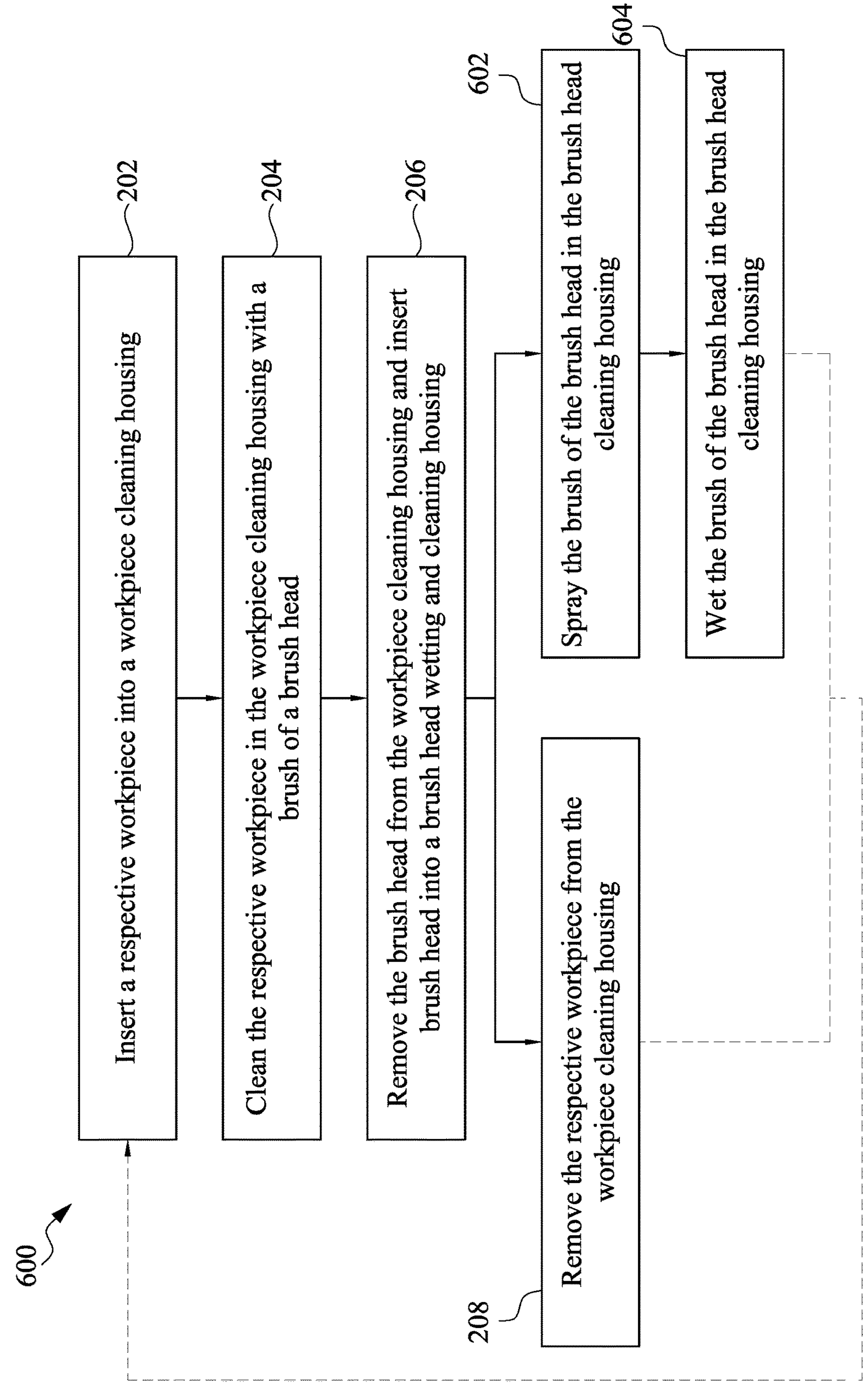
FIG. 9 is a flowchart of an alternative method of cleaning a brush of a brush cleaning system or tool, in accordance with some embodiments.

FIG. 9 is a flowchart 600 of a method of cleaning the surface 310 of the workpiece 306 and the surface 332 of the successive respective workpiece 334. The method in the flowchart 600 includes the first, second, third, and fourth steps 202, 204, 206, 208. However, the method replaces the sixth step 402 as in the method of the flowchart 400 with a seventh step 602 and an eighth step 604. In the method of the flowchart 600, the spray nozzle 132 and the wetting nozzle 136 are not both turned on at the same time. Instead, the spray nozzle 132 is turned on to eject the profiled spray 134 in the seventh step 602 to clean the brush 302 and remove the debris and contaminants 318 from the brush 302. After the seventh step 602, in the eighth step 604 the spray nozzle 132 is turned off such that the spray nozzle 132 does not eject the profiled spray 134 and the wetting nozzle 136 is turned on such that the wetting nozzle 136 ejects the stream 138. The stream 138 ejected from the wetting nozzle 136 then wets or moistens the brush 302. In other words, the cleaning and wetting steps of the sixth step 402 are broken up into two discrete and distinct steps of the seventh step 602 and the eighth step 604, respectively. While in FIG. 9 the seventh step 602 (e.g., cleaning step) occurs before the eighth step 604 (e.g., wetting step), in at least one alternative embodiment, the seventh step 602 may occur after the eighth step 604.

In view of the above discussion, utilizing both the wetting nozzle 136 to eject the stream 138 and the spray nozzle 132 to eject the profiled spray 134 allows for a brush of a brush head to be cleaned and wetted between successive cleaning operations of multiple workpieces. The cleaning of the brush of the brush head reduces replacement costs when running a FAB to process workpieces as the period of time to replace the brush is increased. The cleaning and wetting of the brush increase the prevention of the propagation of defects within respective surfaces of multiple workpieces that are to be cleaned utilizing the brush of the brush head, which reduces waste costs and increases a yield number of the FAB processing the multiple workpieces.

At least one embodiment of a system of the present disclosure may be summarized as including: a brush cleaning housing including: a cavity; a spray opening to access the cavity; and a brush head opening to access the cavity; a brush head including a brush, the brush head configured to, in operation, clean respective workpieces and to be inserted into the brush cleaning housing through the brush head opening; and a spray nozzle in fluid communication with the cavity through the spray opening, the spray nozzle configured to, in operation, clean the brush of the brush head when the brush is within the cavity of the brush cleaning housing.

At least one embodiment of a brush head cleaning housing may be summarized as including: a first housing wall; a second housing wall extending from the first housing wall and transverse to the first housing wall; a third housing wall extending from the first housing wall and transverse to the first housing wall; a cavity delimited by the first housing wall, the second housing wall, and the third housing wall; a brush head opening in the first housing wall and in fluid communication with the cavity; a spray opening in the second housing wall and in fluid communication with the cavity; and a wetting opening in at least one of the following of the second housing wall and the third housing wall.

At least one embodiment of a method of the present disclosure may be summarized as including: moving a brush head from a workpiece cleaning housing to a brush cleaning housing; inserting a brush of the brush head into the brush cleaning housing through a brush head opening; wetting the brush of the brush head with a wetting nozzle; and spraying the brush of the brush head with a spraying nozzle.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system, comprising:

a brush cleaning housing including a cavity, a brush head opening providing access to the cavity, a wetting opening providing access to the cavity, and a spray opening providing access to the cavity, the brush head opening includes a first central axis, the wetting opening includes a second central axis, and the spray opening includes a third central axis, the second central axis is perpendicular to the first central axis aligning the wetting opening, and the third central axis is at an angle greater than 90-degrees relative to the first central axis aligning the spray opening upwards towards the brush head opening;

a brush head including a brush, the brush head configured to, in operation, clean respective workpieces and to be inserted into the cavity of the brush cleaning housing;

a spray nozzle in fluid communication with the cavity of the brush cleaning housing through the spray opening of the brush cleaning housing, wherein the spray nozzle is directed and is aligned along the third central axis, wherein the spray nozzle is configured to, in operation, clean the brush of the brush head when the brush is within the cavity of the brush cleaning housing by ejecting a conical spray profile of a pressurized and atomized fluid, wherein the conical spray profile includes a spray angle ranging from 55 to 75 degrees, wherein the spray nozzle is positioned at a nozzle angle ranging from 5 to 20 degrees relative to a plane perpendicular to the first central axis, and wherein the spray angle and the nozzle angle are selected from the respective ranges to effectively remove debris from the brush and prevent damage to the brush when cleaning the brush, and wherein the spray nozzle ejects the conical spray profile at a first pressure; and a wetting nozzle in fluid communication with the cavity of the brush cleaning housing through the wetting opening of the brush cleaning housing, wherein the wetting nozzle is aligned along the second central axis, wherein the wetting nozzle is configured to, in operation, wet the brush of the brush head when the brush head is within the cavity of the brush cleaning housing by ejecting a stream of fluid, and wherein the wetting nozzle ejects the stream of fluid at a second pressure less than the first pressure.

2. The system of claim 1, wherein:

the brush cleaning housing further includes a first housing wall, a second housing wall transverse to the first housing wall, and a third housing wall transverse to the first housing wall, and the first housing wall extends from the second housing wall to the third housing wall;

the brush head opening extends through the first housing wall to the cavity;

the spray opening extends through the second housing wall to the cavity; and the wetting opening extends through the third housing wall to the cavity.

3. The system of claim 2, wherein:

the brush cleaning housing further includes a spray nozzle reception structure at the second housing wall; and the spray opening extends through a spray nozzle direction structure, and the spray opening is transverse to the second housing wall.

4. The system of claim 1, wherein:
the brush cleaning housing further includes a first housing wall and a second housing wall transverse to the first housing wall;
the brush head opening extends through the first housing wall to the cavity; and
the spray opening extends through the second housing wall to the cavity.

5. The system of claim 1, further comprising a workpiece cleaning housing in close proximity to the brush cleaning housing.

6. The system of claim 5, wherein the brush head is configured to, in operation, move between the workpiece cleaning housing and the brush cleaning housing, be inserted into the cavity of the brush cleaning housing, and be inserted into the workpiece cleaning housing.

7. The system of claim 6, wherein:
the workpiece cleaning housing is configured to, in operation, receive a workpiece to be cleaned by the brush of the brush head; and
the brush head is configured to, in operation, clean the workpiece when within the workpiece cleaning housing.

8. The system of claim 1, wherein:
the brush cleaning housing includes a first housing wall and a second housing wall opposite to the first housing wall;
the wetting opening is along the first housing wall and extends through the first housing wall to the cavity; and
the spray opening is along the second housing wall and extends through the second housing wall to the cavity.

9. The system of claim 8, wherein:
the brush cleaning housing includes an upper housing wall that extends between the first housing wall and the second housing wall; and
the brush head opening is along the upper housing wall and extends through the upper housing wall to the cavity.

10. A system, comprising:
a brush cleaning housing including:
a first housing wall;
a second housing wall extending from the first housing wall and transverse to the first housing wall;
a third housing wall extending from the first housing wall and transverse to the first housing wall;
a cavity delimited by the first housing wall, the second housing wall, and the third housing wall;
a brush head opening in the first housing wall and in fluid communication with the cavity, the brush head opening including a first central axis;
a spray opening in the second housing wall and in fluid communication with the cavity, the spray opening including a second central axis, wherein the second central axis is at a first angle relative to the first central axis aligning the spray opening upwards towards the brush head opening; and
a wetting opening in one of the first housing wall, the second housing wall, or the third housing wall, and the wetting opening in fluid communication with the cavity, the wetting opening including a third central axis, the third central axis is at a second angle relative to the first central axis, wherein the second angle is different from the first angle;
a brush head including a brush, the brush head configured to, in operation, clean respective workpieces and to be inserted into the cavity of the brush cleaning housing through the brush head opening;
a spray nozzle in fluid communication with the cavity of the brush cleaning housing through the spray opening, the spray nozzle is aligned along the second central axis, wherein the spray nozzle is configured to, in operation, clean the brush of the brush head when the brush is within the cavity of the brush cleaning housing by ejecting a conical spray profile of a pressurized and atomized fluid, wherein the conical spray profile includes a spray angle ranging from 55 to 75 degrees, wherein the spray nozzle is positioned at a nozzle angle ranging from 5 to 20 degrees relative to a plane perpendicular to the first central axis, and wherein the spray angle and the nozzle angle are selected from the respective ranges to effectively remove debris from the brush and prevent damage to the brush when cleaning the brush, and wherein the spray nozzle ejects the conical spray profile at a first pressure; and
a wetting nozzle in fluid communication with the cavity of the brush cleaning housing through the wetting opening, the wetting nozzle is aligned along the third central axis, wherein the wetting nozzle is configured to, in operation, wet the brush of the brush head when the brush is within the cavity of the brush cleaning housing by ejecting a stream of fluid, and wherein the wetting nozzle ejects the stream of fluid at a second pressure less than the first pressure.

11. The brush cleaning housing of claim 10, further comprising a spray direction structure protruding from the second housing wall.

12. The brush cleaning housing of claim 11, wherein the spray opening extends through the spray direction structure.

13. The brush cleaning housing of claim 12, wherein a wetting opening in at least one of the following of the second housing wall and the third housing wall.

14. The system of claim 10, wherein the second angle is 90-degrees.

15. The system of claim 10, wherein the wetting nozzle and the spray nozzle are configured to, in operation, simultaneously wet and spray the brush of the brush head.

16. A system, comprising:
a brush cleaning housing including:
a plurality of housing walls;
a cavity delimited by the plurality of housing walls;
a brush head opening along at least one respective housing wall of the plurality of housing walls, the brush head opening having a first central axis;
a spray opening along at least one respective housing wall of the plurality of housing walls, the spray opening having a second central axis, the second central axis is at a first angle relative to the first central axis aligning the spray opening upwards at the brush head opening; and
a wetting opening along at least one respective housing wall of the plurality of housing walls, the wetting opening having a third central axis, the third central axis is at a second angle relative to the first central axis less than the first angle;
a brush head including a brush, the brush head configured to, in operation, clean respective workpieces and to be inserted into the cavity of the brush cleaning housing through the brush head opening; and
a spray nozzle in fluid communication with the cavity of the brush cleaning housing through the spray opening, wherein the spray nozzle is aligned along the second central axis, wherein the spray nozzle is configured to, in operation, clean the brush of the brush head when the brush is within the cavity of the brush cleaning housing by ejecting a conical spray profile of a pressurized and atomized fluid, wherein the conical spray profile includes a spray angle ranging from 55 to 75 degrees, wherein the spray nozzle is positioned at a nozzle angle ranging from 5 to 20 degrees relative to a plane perpendicular to first central axis, and wherein the spray angle and the nozzle angle are selected from the respective ranges to effectively remove debris from the brush and prevent damage to the brush when cleaning the brush, and wherein the spray nozzle ejects the conical spray profile at a first pressure;

a wetting nozzle in fluid communication with the cavity of the brush cleaning housing through the wetting opening, wherein the wetting nozzle is aligned along the third central axis, wherein the wetting nozzle is configured to, in operation, wet the brush of the brush head when the brush is within the cavity of the brush cleaning housing by ejecting a stream of fluid, and wherein the wetting nozzle ejects the stream of fluid at a second pressure less than the first pressure.

17. The system of claim 16, wherein the brush cleaning housing further includes a spray nozzle reception structure along at least one respective housing wall of the plurality of housing walls.

18. The system of claim 17, wherein the spray opening extends through the spray nozzle reception structure.

19. The system of claim 16, further comprising a workpiece cleaning housing in close proximity to the brush cleaning housing.

20. The system of claim 16, wherein:

the spray opening extends through a first housing wall of the plurality of housing walls; and the wetting opening extends through a second housing wall of the plurality of housing walls, and the second housing wall is opposite to the first housing wall.

* * * * *